United States Patent
Yang

(10) Patent No.: US 7,986,572 B2
(45) Date of Patent: Jul. 26, 2011

(54) MAGNETIC MEMORY CAPABLE OF MINIMIZING GATE VOLTAGE STRESS IN UNSELECTED MEMORY CELLS

(75) Inventor: Hsu Kai Yang, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 172 days.

(21) Appl. No.: 12/583,255

(22) Filed: Aug. 17, 2009

(65) Prior Publication Data
US 2011/0038200 A1    Feb. 17, 2011

(51) Int. Cl.
*G11C 7/00* (2006.01)
(52) U.S. Cl. .............. 365/189.16; 365/189.09; 365/173; 365/171; 365/158; 365/190
(58) Field of Classification Search .......... 365/158, 365/173, 171, 190, 189.09, 189.16, 225.5
See application file for complete search history.

(56) References Cited

U.S. PATENT DOCUMENTS

| | | | |
|---|---|---|---|
| 5,515,314 A * | 5/1996 | Kouhei et al. ............. | 365/158 |
| 6,285,581 B1 * | 9/2001 | Tehrani et al. ............ | 365/173 |
| 6,714,390 B2 | 3/2004 | Terada et al. | |
| 6,754,055 B2 | 6/2004 | Ono et al. | |
| 6,961,265 B2 | 11/2005 | Witcraft et al. | |
| 6,985,382 B2 | 1/2006 | Fulkerson et al. | |
| 7,046,547 B2 | 5/2006 | Witcraft et al. | |
| 2003/0090925 A1 | 5/2003 | Demange et al. | |
| 2004/0100835 A1 | 5/2004 | Sugibayashi et al. | |
| 2009/0168505 A1 | 7/2009 | Hanzawa et al. | |
| 2009/0180310 A1 | 7/2009 | Shimomura et al. | |
| 2011/0038200 A1 * | 2/2011 | Yang ........................... | 365/171 |

OTHER PUBLICATIONS

International Search Report PCT/US 10/01896, Aug. 13, 2010, Magic Technologies, Inc.

* cited by examiner

*Primary Examiner* — Andrew Q Tran
(74) *Attorney, Agent, or Firm* — Saile Ackerman LLC; Stephen B. Ackerman; Larry J. Prescott

(57) ABSTRACT

Magnetic memory elements such as Phase Change RAM and Spin Moment Transfer MRAM require high programming currents. These high programming currents require high gate to source/drain voltages for the cell transistors controlling these programming currents, which can degrade the reliability of these cell transistors. This invention describes a circuit and method to write information into individual memory cells while minimizing the gate voltage stress in the cell transistors of the memory cells in which no information is being written. The circuit of this invention has a separately controllable word line voltage supply for each row of the memory array and a separately controllable voltage supply for each bit line of the memory array. During the write operation the voltage is raised for the word line of only one row of the array. The bit line voltages are then adjusted so that a 1 is written into the desired cells in that row and a 0 is written into the desired cells in that row.

20 Claims, 3 Drawing Sheets

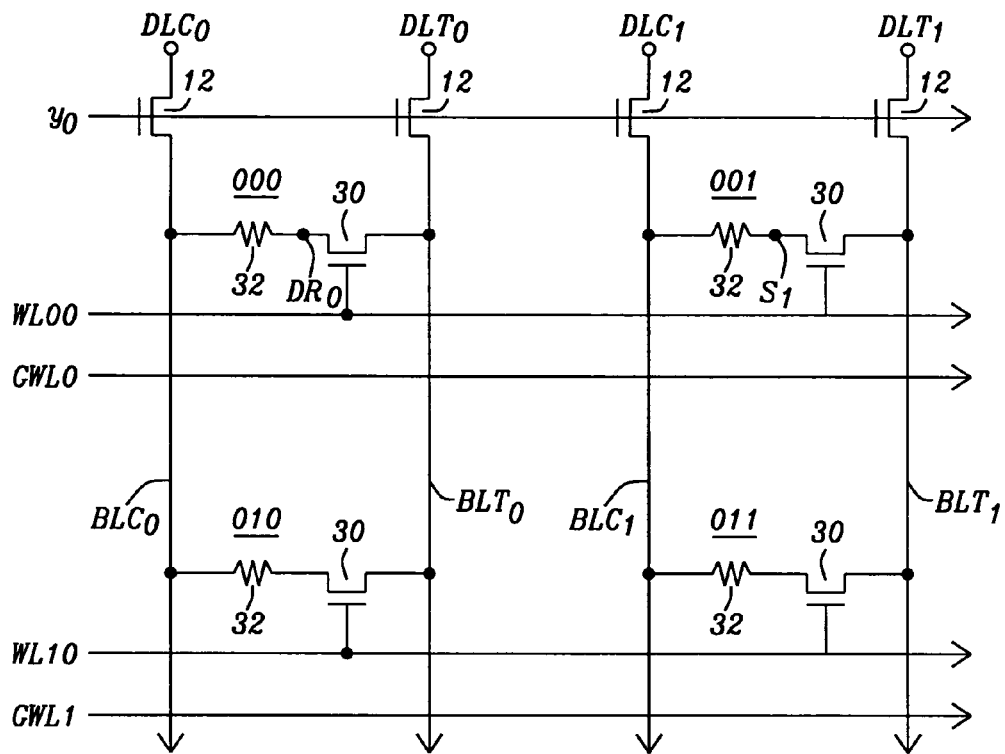
FIG. 2
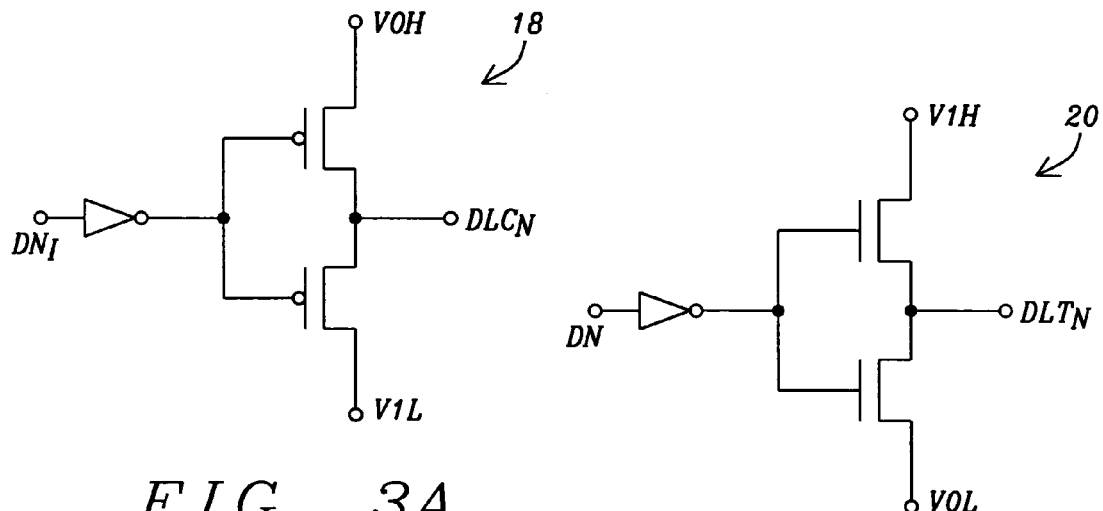
FIG. 3A
FIG. 3B

US 7,986,572 B2

MAGNETIC MEMORY CAPABLE OF MINIMIZING GATE VOLTAGE STRESS IN UNSELECTED MEMORY CELLS

BACKGROUND OF THE INVENTION (1) Field of the Invention

This invention relates to gate drive voltage for magnetic memory technologies, such as Phase Change RAM and Spin Moment Transfer MRAM, sometimes referred to as Spin Torque Transfer MRAM, cells which require programming currents higher than the minimum cell transistor can provide without degrading the life of the cell transistor. More particularly the invention relates to circuits and methods for programming these cell transistors by applying high voltages between the gate and source or drain of the cell transistor only to those cell transistors into which a one or zero is being written.

(2) Description of Related Art

U.S. Pat. No. 7,046,547 B2 and U.S. Pat. No. 6,961,265 B2 to Witcraft et al. describe methods and apparatus that allow data to be stored in a magnetic memory cell, such as a giant magneto-resistance cell. The inventions describe advantageously winding a word line around a magnetic memory cell to increase the magnetic field induced by the word line.

U.S. Pat. No. 6,985,382 B2 to Fulkerson et al. describe a technique to read a stored state in a magneto-resistive random access memory device, MRAM, such as a giant magneto-resistance MRAM device or a tunneling magneto-resistance device, TMR. The technique uses a bit line that is segmented into a first portion and a second portion. An interface circuit compares the resistance of a first portion and a second portion of a first bit line to the resistance of a first portion and a second portion of a second bit line to determine the logical state of a cell in the first bit line.

U.S. Pat. No. 6,754,055 B2 to Ono et al. describes a giant magneto-resistive effect element which includes a laminated layer film having a ferromagnetic film, a non-magnetic film, and an anti-ferromagnetic film.

U.S. Pat. No. 6,714,390 B2 describes a giant magneto-resistive effect element capable of producing a high output and a high resistance and which can cope with a high recording density and a magneto-resistive effect type head, a thin film magnetic memory, and a thin film magnetic sensor each of which includes this giant magneto-resistive effect element.

SUMMARY OF THE INVENTION

Magnetic memory elements using the Giant magneto-resistive effect, such as Phase Change RAM and Spin Moment Transfer MRAM, sometimes referred to as Spin Torque Transfer MRAM, require high programming currents. Since these currents are controlled by a cell transistor, which is a field effect transistor, a high voltage between the source and/or drain is required to produce sufficient memory cell current to program the memory cells. This high gate to source/drain voltage and high memory cell current can significantly reduce the life of the cell transistor.

It is a principal objective of this invention to provide a circuit which can write information into individual memory cells, a one or a zero, while minimizing the gate voltage stress in the cell transistors of the memory cells in which no information is being written.

It is another principal objective of this invention to provide a method of writing information into individual memory cells, a one or a zero, while minimizing the gate voltage stress in the cell transistors of the memory cells in which no information is being written.

These objectives are achieved by methods and circuits which apply the high gate to drain voltage, or gate to source voltage only to those cells in which a 1 or a 0 is to be written so that only these cells see the high gate to source/drain voltage stress. Since these cell transistors see the high stress only when that cell is written the reliability of the cell transistors is not significantly degraded.

The circuit of this invention has a separately controllable word line voltage supply for each row of the memory array and a separately controllable voltage supply for each bit line of the memory array. During the write operation the voltage is raised for the word line of only one row of the array. The bit line voltages are then adjusted so that a 1 is written into the desired cells in that row and a 0 is written into the desired cells in that row.

BRIEF DESCRIPTION OF THE DRAWINGS

FIG. 2 shows a schematic diagram of a 2×2 section of the memory array.

FIGS. 3A and 3B show a schematic diagram of circuits used to produce data line voltages for the circuit of this invention.

DESCRIPTION OF THE PREFERRED EMBODIMENTS

Figure 1:
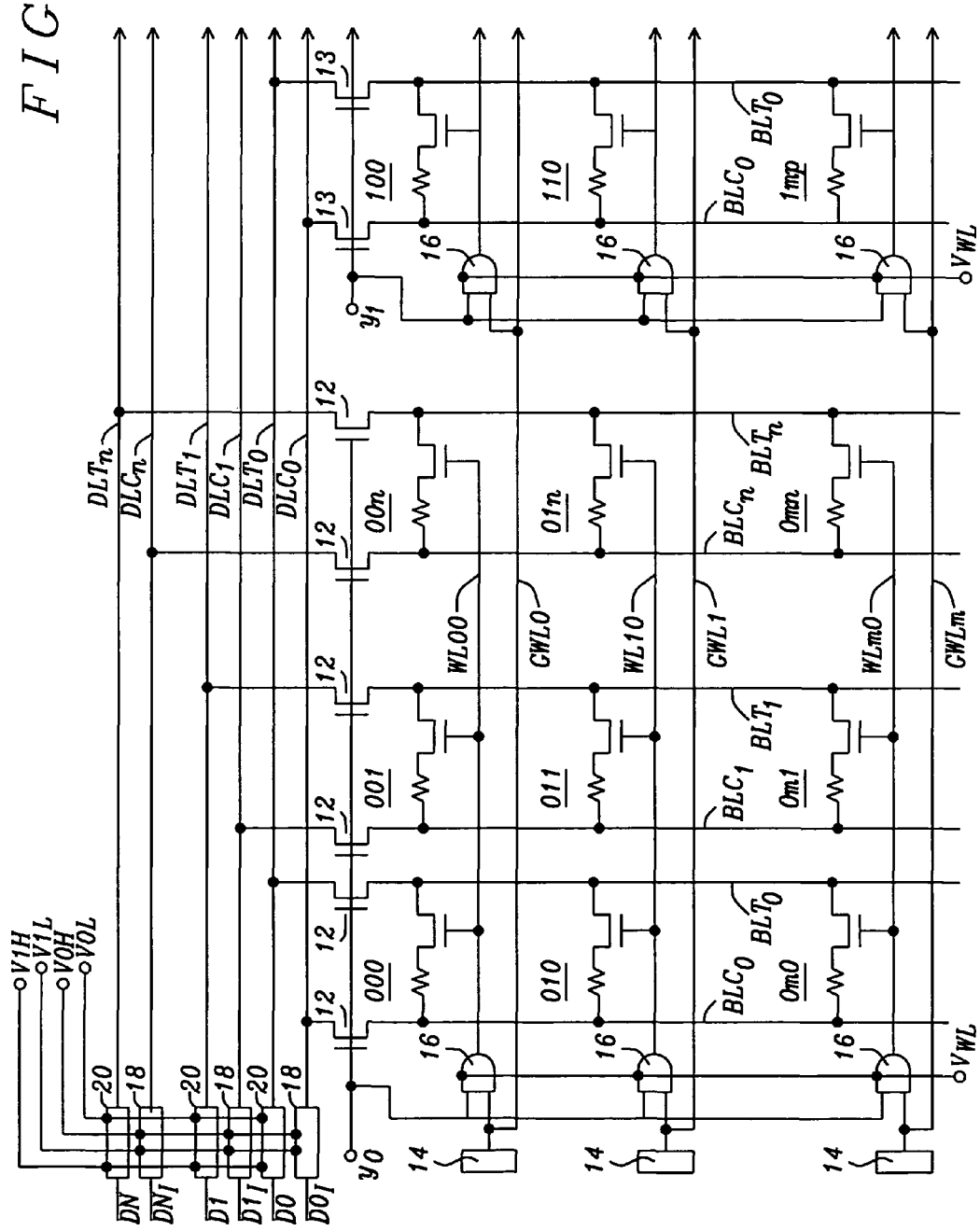
FIG. 1 shows a schematic diagram of the circuit of this invention.

Refer now to the Drawings for a description of the preferred embodiments of this invention. FIG. 1 shows one section, section 0, of a magnetic memory comprising an n column by m row array of magnetic memory cells 000, 001, ..., 00n, 010, 011, ..., 01n, 0m0, 0m, ... 0mn. FIG. 1 also shows the beginning of another section, section 1, of the magnetic memory showing magnetic memory cells 110, 111, ..., 1m0. This description will describe the example of section 0, as those skilled in the art will readily understand how the invention is applied to other sections as they are selected. FIG. 2 shows a schematic diagram of memory cells 000, 001, 010, and 011 showing each memory cell having a cell transistor 30 and a magnetic memory element 32 with one terminal of the magnetic memory element 32 connected to one of the source/drain terminals of the cell transistor 30. In FIG. 2 this node between the cell transistor 30 and magnetic memory element 32 is designated by the reference number $DR_0$ in cell 000 and the reference number $S_1$ in cell 001 because the following example will describe writing a 0 in cell 000, where this node is a drain, and a 1 in cell 001, where this node is a source. Whether the source/drain terminals of the cell transistor are considered a source or a drain depends on the direction of the current through the cell transistor. All transistors in this description are field effect transistors.

Refer again to FIG. 1 which shows that each memory cell has a BLC line; $BLC_0$, $BLC_1$, ... $BLC_N$; and a BLT line; $BLT_0$, $BLT_1$, ... $BLT_N$. Each of the BLC and BLT lines are connected through a bit line transistor 12 to a data line, the $BLC_0$ line to the $DLC_0$ line, the $BLC_1$ line to the $DLC_1$ line, the $BLT_0$ line to the $DLT_0$, the $BLT_1$ line to the $DLT_1$ line and so forth with the $BLC_N$ line connected to the $DLC_N$ line and the $BLT_N$ line connected to the $DLT_N$ line. The gates of the bit line transistors 12 in the first section are all connected together to bit line signal source $y_0$ so that all of the bit line transistors 12 in this section are turned on or off at the same time. This allows a particular voltage to be supplied to each of the BLC and BLT lines independently by the data lines $DLC_0$, $DLT_0$, $DLC_1$, $DLT_1$, ..., $DLC_N$, and $DLT_N$. The data lines provide a supply of selected voltages to the BLT and BLC lines. The signal source $y_0$ also allows the enhanced voltage level, $V_{WL}$, to be applied to selected rows of section 0 of the memory when desired. The gates of the bit line transistors 13 in the second section are also all connected together to bit line signal source $y_1$ so that all of the bit line transistors 13 in this section are turned on or off at the same time. The signal source $y_1$ prevents voltage from being applied to the BLT and BLC lines in section 1 of the memory and prevents the enhanced voltage level, $V_{WL}$, to be applied to any rows of section 1 of the memory while section 0, or other sections of the memory, are being written. The memory may have other sections which are connected and operated in similar fashion. This invention will be described with reference to section one only, however those skilled in the art will recognize that the invention can be applied to other sections in similar fashion.

The voltages on the DLC lines are supplied by first data line drivers 18 and the voltages on the DLT lines are supplied by second data line drivers 20. The voltages to the first data line drivers 18 are supplied by V1L and V0H voltage supplies and the inverse data line signals $D0_1, D1_1, ..., DN_1$. The voltages to the second data line drivers 20 are supplied by V1H and V0L voltage supplies and the data line signals D0, D1, ..., DN. The first data line drivers 18 are shown in FIG. 3A where an inverse data line signal for memory cell N, $DN_1$, switches the output $DLC_N$ signal for memory line N between V0H and V1L. The second data line drivers 20 are shown in FIG. 3B where a data line signal for memory cell N, DN, switches the output $DLT_N$ signal for memory line N between V1H and V0L.

The word lines WL00, WL10, ..., WLm0 and the global word lines GWL0, GWL1, ..., GWLm are driven by row decoders 14. The word lines WL00, WL10, ..., WLm0 are also driven by high voltage word line segment drivers 16 which can supply a higher voltage $V_{WL}$ to a selected word line during the writing operation which will be described next.

Figure 4:
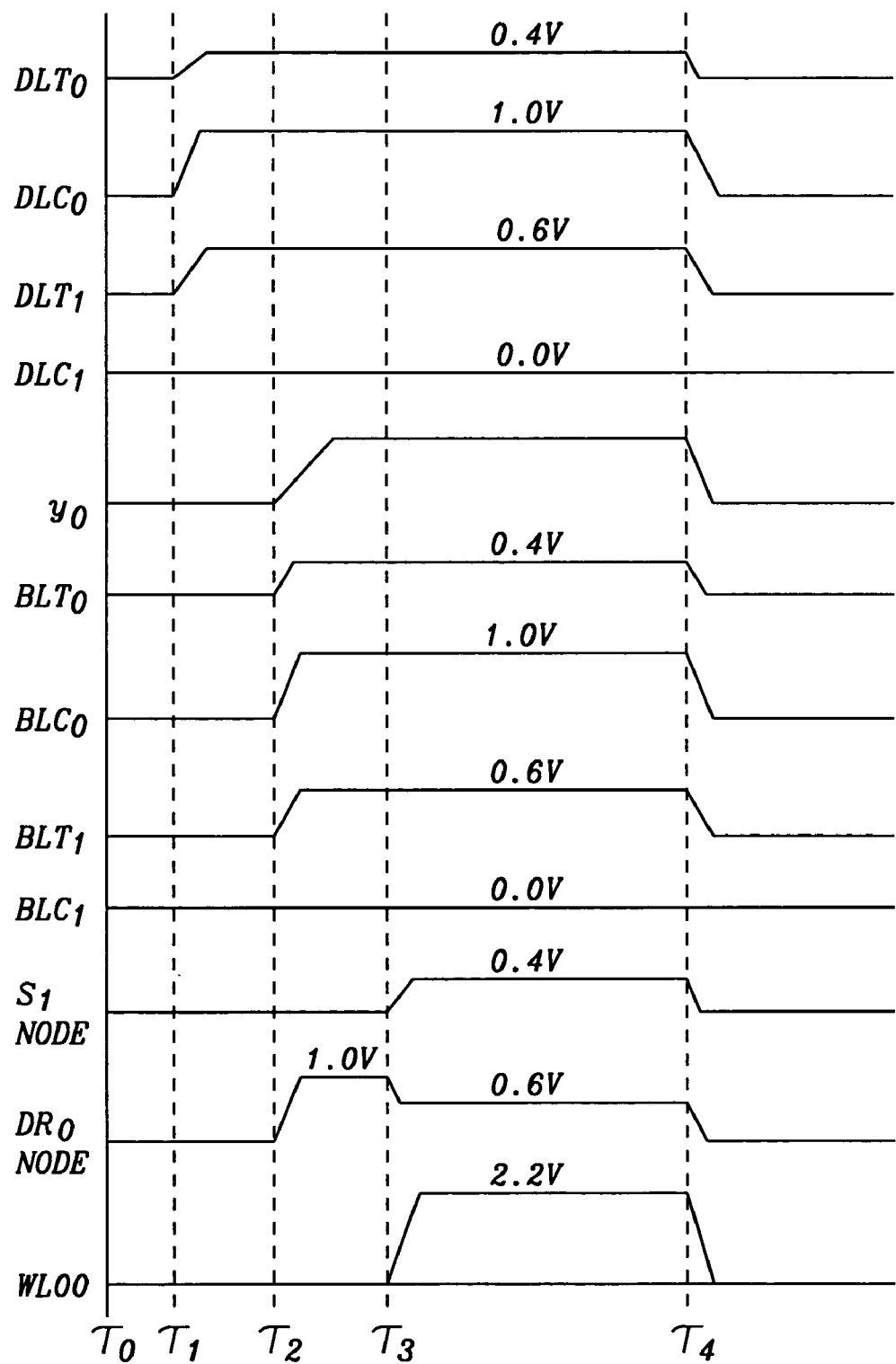
FIG. 4 shows a timing diagram of the voltages used to write a 0 into cell 000 and a 1 into cell 001.

Refer now to FIGS. 2 and 4 for description of the circuit and method of this invention for writing a 1 and/or a 0 into magnetic memory elements. This example will show simultaneously writing a 0 in cell 000 and a 1 into cell 001. FIG. 2 shows a smaller section of the memory array showing memory cells 000, 001, 010, and 011. Writing a 0 in a cell requires causing a current to flow from the magnetic memory element 32 into the cell transistor 30. Writing a 1 in a cell requires causing a current to flow from the cell transistor 30 into the magnetic memory element 32. The magnetic memory element 32 can be approximated as a resistor and this approximation will be used in this example. In this example, the current required to write a 0 in a magnetic memory element 32 causes a voltage drop of about 0.4 volts across the magnetic memory element 32. In this example, the current required to write a 1 in a magnetic memory element 32 also causes a voltage drop of about 0.4 volts across the magnetic memory element 32.

FIG. 4 shows a timing diagram for the example of simultaneously writing a 0 in cell 000 and a 1 in cell 001. As shown in FIG. 4 in the interval between T1 and T2 data line $DLT_0$ goes from 0 volts to 0.4 volts, data line $DLC_0$ goes from 0 volts to 1.0 volts, data line $DLT_1$ goes from 0 volts to 0.6 volts, and data line $DLC_1$ remains at 0 volts. Also in the interval between T1 and T2 the signal $y_0$ to the bit line transistors 12 remains low so that the bit line transistors 12 are turned off, bit line $BLT_0$, bit line $BLC_0$, bit line $BLT_1$, and bit line $BLC_1$ remain at 0 volts. Also between T1 and T2 the node between the cell transistor 30 and the magnetic memory element 32 in cell 000, designated here as node $DR_0$ since it is connected to the cell transistor terminal acting as a drain in this case, the node between the cell transistor 30 and the magnetic memory element 32 in cell 001, designated here as node $S_1$ since it is connected to the cell transistor terminal acting as a source in this case; and the word line $WL_{00}$ connected to the cell transistors 30 in the row in which cells 000 and 001 are located remain at 0 volts.

In the interval between T2 and T3 data line $DLT_0$ remains at 0.4 volts, data line $DLC_0$ remains at 1.0 volts, data line $DLT_1$ remains at 0.6 volts, and data line $DLC_1$ remains at 0 volts. Also in the interval between T2 and T3 the signal $y_0$ to the bit line transistors 12 becomes high so that the bit line transistors 12 are turned on, bit line $BLT_0$ goes to 0.4 volts, bit line $BLC_0$ goes to 1.0 volts, bit line $BLT_1$ goes to 0.6 volts, bit line $BLC_1$ and word line $WL_{00}$ remain at 0 volts. Since the word line $WL_{00}$ voltage remains at 0 volts the cell transistors 30 in cells 000 and 001 remain turned off so that the voltage of the $D_0$ node goes to 1.0 volts, because of the voltage of the $BLC_0$ line, and the voltage of the $S_1$ node remains at 0 volts, because of the voltage of the $BLC_1$ line.

In the interval between T3 and T4 data line $DLT_0$ remains at 0.4 volts, data line $DLC_0$ remains at 1.0 volts, data line $DLT_1$ remains at 0.6 volts, data line $DLC_1$ remains at 0 volts, the signal $y_0$ to the bit line transistors 12 remains high so that the bit line transistors 12 remain turned on, bit line $BLT_0$ remains at 0.4 volts, bit line $BLC_0$ remains at 1.0 volts, bit line $BLT_1$ remains at 0.6 volts, and bit line $BLC_1$ remains at 0 volts. In the interval between T3 and T4 the word line $WL_{00}$ voltage goes to 2.2 volts which allows the cell transistors 30 in cells 000 and 001 to pass sufficient current to write a 0 in cell 000 and a 1 in cell 001. With the cell transistor 30 in cell 000 passing sufficient current to write a 0 in cell 000 and a 1 in cell 001 the voltage drop across the magnetic memory element in these cells is 0.4 volts reducing the voltage at the $DR_0$ node in cell 000 to 0.6 volts and raising the voltage at the $S_1$ node in cell 001 to 0.4 volts.

During the writing of a 0 in cell 000 and a 1 in cell 001 the worst case voltage stress between the gate, at 2.2 volts, and the source/drain terminals of the cell transistor in cells 000 and 001 is 1.8 volts, since the $BLT_0$ node is at 0.4 volts in cell 000 and the $S_1$ node is at 0.4 volts in cell 001. The high voltage of 2.2 volts is only applied to one row of the cells in the section being written and the same worst case voltage applies whether a 1 or a 0 is being written in a cell in that row. After $T_4$ the voltages revert to the beginning levels and a new cycle can begin.

During this write cycle the signal $y_1$ to the bit line transistors 13 in section 1 of the memory as well as the signals to the other bit line transistors in other sections of the memory, not shown, remains low so that these bit line transistors remain turned off. The high voltage is restricted to that section by signals to the corresponding bit line transistors, such as the signal $y_1$ to the bit line transistors 13 in that part of the next section of the memory shown in FIG. 1 and to the global word lines GLW0, GLW1, ..., GLWm. Similar signals are applied to those bit line transistors and global word lines not shown in FIG. 1. Memory cells 100, 110, ..., 1m0 are also shown in FIG. 1.

The voltages described here are for a particular example and different voltages could be used to achieve the same effect.

While the invention has been particularly shown and described with reference to the preferred embodiments thereof, it will be understood by those skilled in the art that various changes in form and details may be made without departing from the spirit and scope of the invention.

What is claimed is:

1. A method of writing magnetic random access memory elements requiring high programming currents, comprising:
providing a plurality of memory cells arranged in an array of m rows and n columns, wherein each memory cell has a magnetic memory element, each said magnetic memory element having a first terminal and a second terminal, and a cell transistor, each said cell transistor having a first source/drain terminal connected to said second terminal of said magnetic memory element, a gate, and a second source/drain terminal, and wherein said memory cell stores a 1 by causing a first current to flow from said cell transistor into said magnetic memory element and stores a 0 by causing a second current to flow from said magnetic memory element into said cell transistor;
providing a BLT line and a BLC line for each column of said array;
providing a word line for each row of said array;
connecting said first terminal of said magnetic memory elements in those said magnetic memory cells in each of said n columns to one of said BLC lines;
connecting said second source/drain terminal, of each of said cell transistors in those said magnetic memory cells in each of said n columns to one of said BLT lines;
connecting said gate of each of said cell transistors in those said magnetic memory cells in each of said m rows to one of said word lines;
selecting one of said rows of said array; and
writing a 1 or a 0 in selected magnetic memory cells in said selected row of said array by applying a first voltage to said word line for that said row, a second voltage to those BLC lines and a third voltage to those BLT lines connected to those magnetic memory cells in which a 1 is to be written, a fourth voltage to those BLC lines and a fifth voltage to those BLT lines connected to those magnetic memory cells in which a 0 is to be written, and a sixth voltage to the remaining word lines in said array wherein said sixth voltage is less than said first voltage.

2. The method of claim 1 wherein said first voltage is about 2.2 volts.

3. The method of claim 1 wherein said second voltage is about 0 volts and said third voltage is about 0.6 volts.

4. The method of claim 1 wherein said fourth voltage is about 1.0 volts and said fifth voltage is about 0.4 volts.

5. The method of claim 1 wherein said cell transistors are field effect transistors.

6. The method of claim 1 wherein the maximum voltage between said gate of said cell transistor and either said first or second said source/drain terminal of said cell transistor is 1.8 volts when writing a 1 or a 0 into said magnetic memory element.

7. The method of claim 1 wherein said sixth voltage is about zero volts.

8. The method of claim 1 wherein said magnetic memory elements can be approximated as a resistor.

9. The method of claim 1 wherein said writing a 1 or a 0 in said magnetic memory element causes a voltage drop across said magnetic memory element of about 0.4 volts.

10. The method of claim 1 wherein said writing a 1 or a 0 in said magnetic memory element requires a voltage drop between said first source/drain terminal of said cell transistor and said second source/drain terminal of said cell transistor of about 0.4 volts.

11. A circuit for writing magnetic random access memory elements requiring high programming currents, comprising:
a plurality of memory cells arranged in an array of m rows and n columns, wherein each memory cell has a magnetic memory element, each said magnetic memory element having a first terminal and a second terminal, and a cell transistor, each said cell transistor having a first source/drain terminal connected to said second terminal of said magnetic memory element, a gate, and a second source/drain terminal, and wherein said memory cell stores a one by causing a first current to flow from said cell transistor into said magnetic memory element and stores a zero by causing a second current to flow from said magnetic memory element into said cell transistor;
a BLC line connected to said first terminal of said magnetic memory elements in those said magnetic memory cells in each of said n columns of said array;
a BLT line connected to said second source/drain connection of each of said cell transistors in those said magnetic memory cells in each of said n columns of said array;
a word line connected to said gate of each of said cell transistors in those said magnetic memory cells in each of said m rows of said array;
a first variable voltage source connected to said gates of said cell transistors in each of said rows of said array;
a second variable voltage source connected to each of said BLC lines in said array; and
a third variable voltage source connected to each of said BLT lines of said array.

12. The circuit of claim 11 wherein said first voltage source can supply a voltage of about 2.2 volts or about 0 volts.

13. The circuit of claim 11 wherein said second voltage source can supply voltages of about 0.4 volts or about 0.6 volts.

14. The circuit of claim 11 wherein said third voltage source can supply voltages of about 0 volts or about 1.0 volts.

15. The circuit of claim 11 wherein said first voltage source can supply different voltages for different rows of said array.

16. The circuit of claim 11 wherein said second voltage source and said third voltage source can supply different voltages for different columns of said array.

17. The circuit of claim 11 wherein said cell transistors are field effect transistors and the maximum voltage between said gate of said cell transistor and either said first or second said source/drain terminal of said cell transistor is 1.8 volts when writing a 1 or a 0 into said magnetic memory element.

18. The circuit of claim 11 wherein said magnetic memory elements can be approximated as a resistor.

19. The circuit of claim 11 wherein said writing a 1 or a 0 in said magnetic memory element causes a voltage drop across said magnetic memory element of about 0.4 volts.

20. The circuit of claim 11 wherein said writing a 1 or a 0 in said magnetic memory element requires a voltage drop between said first source/drain terminal of said cell transistor and said second source/drain terminal of said cell transistor of about 0.4 volts.

* * * * *